(12) United States Patent
Zhan et al.

(10) Patent No.: US 11,870,417 B2
(45) Date of Patent: Jan. 9, 2024

(54) DIFFERENTIAL RESONATOR AND MEMS SENSOR

(71) Applicant: AAC ACOUSTIC TECHNOLOGIES (SHENZHEN) CO., LTD., Shenzhen (CN)

(72) Inventors: Zhan Zhan, Shenzhen (CN); Yang Li, Shenzhen (CN); Yuwei Liu, Singapore (SG); Qiuyu Tan, Singapore (SG); Rui Zhang, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 779 days.

(21) Appl. No.: 16/986,305

(22) Filed: Aug. 6, 2020

(65) Prior Publication Data

US 2020/0412324 A1    Dec. 31, 2020

Related U.S. Application Data

(63) Continuation of application No. PCT/CN2019/093342, filed on Jun. 27, 2019.

(51) Int. Cl.
*H03H 9/02*    (2006.01)
*H03H 9/09*    (2006.01)

(52) U.S. Cl.
CPC .......... *H03H 9/02433* (2013.01); *H03H 9/09* (2013.01); *H03H 2009/0248* (2013.01); *H03H 2009/02283* (2013.01)

(58) Field of Classification Search
CPC ..... H03H 9/02433; H03H 2009/02283; H03H 2009/0248
See application file for complete search history.

(56) References Cited

U.S. PATENT DOCUMENTS

| | | | | |
|---|---|---|---|---|
| 2010/0126269 A1* | 5/2010 | Coronato | ............... | G01C 19/56 73/504.04 |
| 2014/0260610 A1* | 9/2014 | McNeil | ............. | G01C 19/5712 73/504.12 |
| 2015/0114112 A1* | 4/2015 | Valzasina | ............... | G01C 19/56 73/504.12 |

* cited by examiner

*Primary Examiner* — Samuel S Outten
(74) *Attorney, Agent, or Firm* — W&G Law Group

(57) ABSTRACT

The present disclosure provides a differential resonator and a MEMS sensor. The differential resonator includes a substrate, a first resonator, a second resonator and a coupling mechanism. The first resonator is connected with the second resonator through the coupling mechanism, and the first resonator and the second resonator are connected with the substrate and are able to be displaced relative to the substrate. The coupling mechanism includes a coupling arm, a support shaft, a first connecting piece and a second connecting piece. The coupling arm includes a first force arm, a second force arm and a coupling portion. The support shaft has one end connected with the substrate, and one other end connected with the coupling portion. The first force arm is connected with the first resonator through the first connecting piece, and the second force is connected with the second resonator through the second connecting piece.

7 Claims, 5 Drawing Sheets

Micro Electromechanical Systems (MEMS)

Differential Resonator

FIG. 7

DIFFERENTIAL RESONATOR AND MEMS SENSOR

TECHNICAL FIELD

The present disclosure relates to the field of micro electromechanical systems (MEMS) technology, in particular to a differential resonator and a MEMS sensor.

BACKGROUND

Differential resonator has a higher quality factor, which can suppress common-mode interference with external acceleration, vibration, temperature and etc., and can effectively lower circuit noise level. Therefore, adopting a differential motion mode is an optimized mainstream solution to improve the performance of MEMS sensors.

As shown in FIG. 1 to FIG. 2, the traditional differential resonator 4 includes a first resonator 41, a second resonator 42, a coupling mechanism 44 connecting the first resonator 41 and the second resonator 42, and a substrate 40. Herein, the first resonator 41, the second resonator 42 and the coupling mechanism 44 connecting the first resonator 41 and the second resonator 42 are all fixed to the substrate 40, and the first resonator 41 and the second resonator 42 are of the same amplitude-frequency response characteristics, that is, it is necessary to ensure that the geometric dimensions of the first resonator 41 and the second resonator 42 are almost identical. The coupling mechanism 14 includes a serpentine fulcrum lever 441 which is connected with the base 40. The first resonator 41 and the second resonator 42 are reversely associated under the steering principle of equal arm lever. The differential motion mode that the first resonator 41 and the second resonator 42 driven by a same external force are mutually reversely displaced by $\Delta Y$ in the vibration direction is realized.

However, in the manufacturing process of the differential resonator, it is not possible to achieve that the geometric dimensions of the first resonator 41 and the second resonator 42 are almost identical.

As shown in FIG. 3, driven by the same external force, the first resonator 41 and the second resonator 42 may produce different amplitude outputs, that is, the displacements $Y_A$, $Y_B$ of the first resonator 41 and the second resonator 42 in the same vibration direction are different, $Y_A \neq Y_B$, which will force the fulcrum of the serpentine fulcrum lever 441 to have a displacement of $\Delta X$ in the X direction where the constraint is weak, eventually causing the lever arm length ratio of the serpentine fulcrum lever 441 to be changed from the original 1:1 to $Y_A/Y_B$ during the lever rotation. Therefore, the traditional differential resonator has disadvantages such as low process robustness, small quality factor, and poor capability for suppression of common-mode interference.

Therefore, how to improve the process robustness of the differential resonator so as to enhance the quality factor and the capability for suppression of common-mode interference of the differential resonator is an urgent technical problem to be solved by those skilled in the art.

SUMMARY

The present disclosure provides a differential resonator and a MEMS sensor, aiming at improving a quality factor of the differential resonator so as to enhance a common-mode interference suppression capability of the differential resonator.

In order to achieve the above objective, the present disclosure provides a differential resonator. The differential resonator includes a substrate, a first resonator, a second resonator and a coupling mechanism. The first resonator is connected with the second resonator through the coupling mechanism, and the first resonator and the second resonator are connected with the substrate and are able to be displaced relative to the substrate under an external force. The coupling mechanism includes a coupling arm, a support shaft, a first connecting piece and a second connecting piece. The coupling arm includes a first force arm, a second force arm and a coupling portion. The support shaft has one end connected with the substrate and one other end connected with the coupling portion. The first force arm and the second force arm are symmetrically arranged on opposite sides of the coupling portion with the support shaft as a symmetry axis, and one end of the first force arm disposed away from the coupling portion is connected with the first resonator through the first connecting piece, and one end of the second force arm disposed away from the coupling portion is connected with the second resonator through the second connecting piece.

As an improvement, the coupling portion comprises a body and at least two spokes, the body is connected with the first force arm and the second force arm, the at least two spokes each has one end connected with the body and one other end connected with the support shaft.

As an improvement, the at least two spokes each is scattered with an axis of the support shaft as a center and connected with the body.

As an improvement, the at least two spokes are of the same length and are evenly arranged.

As an improvement, an arc portion is formed on one side of the body adjacent to the at least two spokes, and the at least two spoke each has one end connected with the arc portion.

As an improvement, the body has two opposite sides, one of which is connected with the first force arm, and the other of which is connected with the second force arm, and the body protrudes from the first force arm and the second force arm along a vibration direction of the first resonator or the second resonator.

As an improvement, the at least two spokes each is an elastic spoke made of an elastic material.

As an improvement, the coupling arm and the support shaft are integrally formed.

As an improvement, both the first connecting piece and the second connecting piece are elastic connecting pieces.

In order to achieve the above objective, the present disclosure further provides a MEMS sensor. The MEMS sensor includes the aforementioned differential resonator.

Compared with the existing technology, the differential resonator and MEMS sensor provided in the present disclosure have the following advantages.

The support shaft is provided and utilized to be fixedly connected with the substrate and connected with the coupling arm. The first force arm of the coupling arm is connected with the first resonator through the first connecting piece, and the second force arm of the coupling arm is connected with the second resonator through the second connecting piece. When an external is applied, even if there is a certain quality deviation between the first resonator and the second resonator, the coupling arm may not displace in the direction perpendicular to the vibration direction of the first resonator and the second resonator under the limiting action of the support shaft when the coupling arm rotates with the support shaft as the fulcrum, so that the first resonator and the second resonator of the differential resonator have more consistent amplitudes, and further, the differential resonator has batter process robustness, and higher quality factor and improved capability for suppression of common-mode interference.

BRIEF DESCRIPTION OF THE DRAWINGS

FIG. 7 is a schematic diagram of a micro electromechanical systems sensor provided in the present disclosure.

DETAILED DESCRIPTION

In order to make the objective, the technical solution and the advantages of the present disclosure clearer, the present disclosure will be explained below in detail with reference to the accompanying drawings and embodiments. It should be understood that the specific embodiments described herein merely intend to explain the present disclosure rather than limit the present disclosure.

Figure 1:
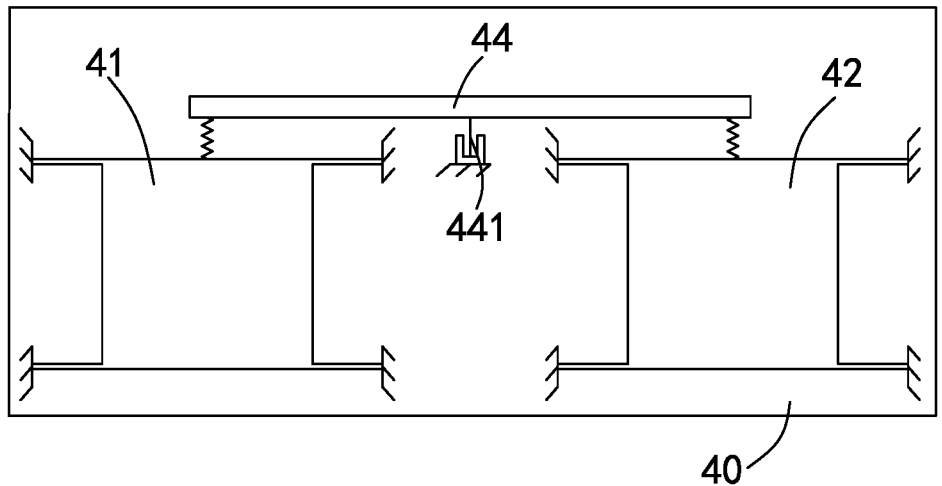
FIG. 1 is a schematic diagram of a plane structure of a differential resonator in the existing technology.
Figure 2:
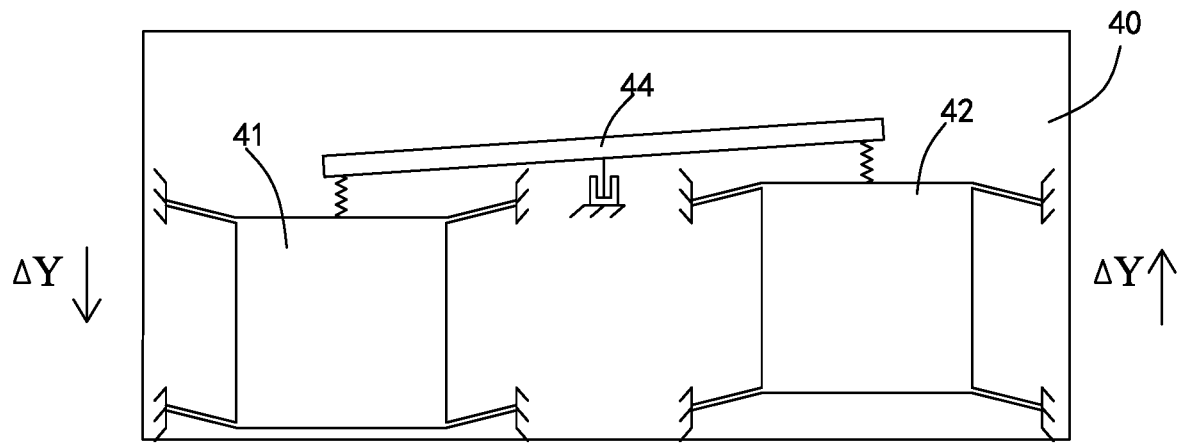
FIG. 2 is a schematic diagram of a plane structure of the differential resonator during vibration in the existing technology in an ideal state.
Figure 3:
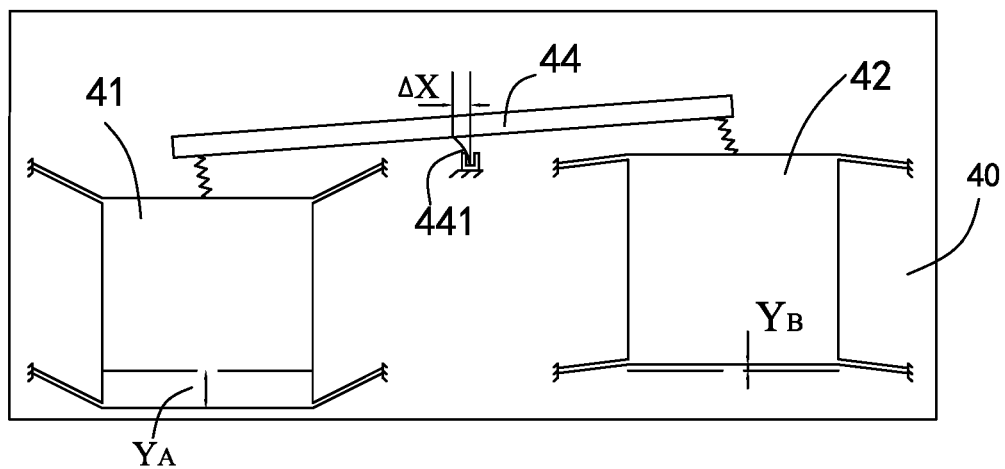
FIG. 3 is a schematic diagram of a plane structure of the differential resonator during vibration in the existing technology in an actual state.
Figure 4:
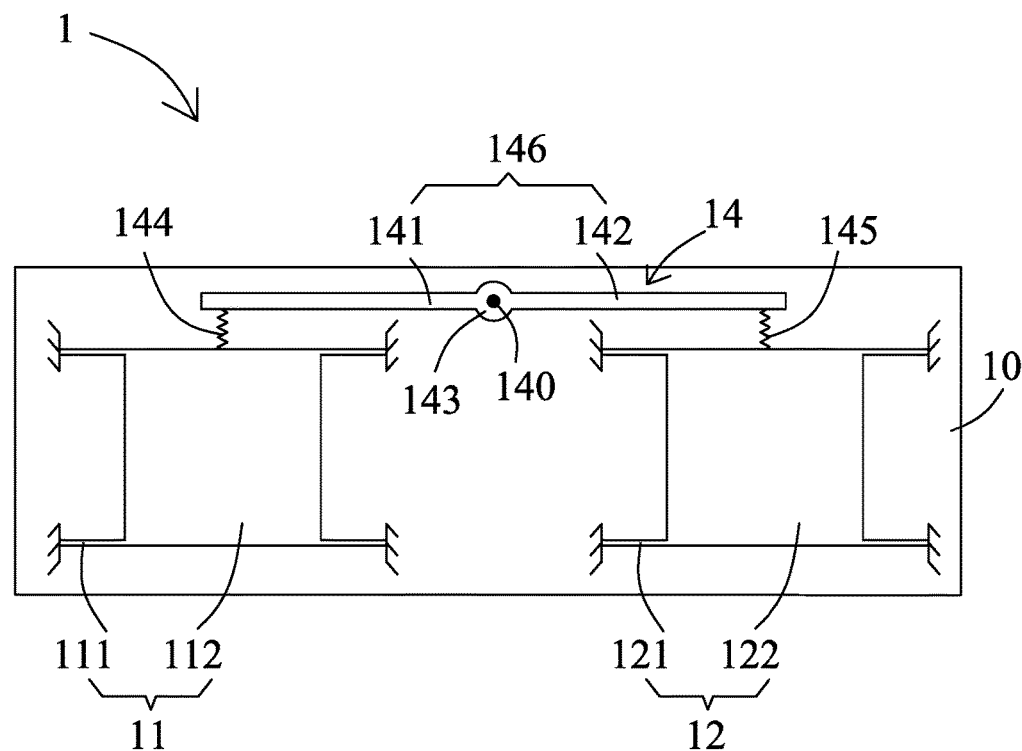
FIG. 4 is a schematic diagram of a plane structure of a differential resonator provided by an embodiment of the present disclosure.

Referring to FIG. 4, the present disclosure provides a differential resonator 1. The differential resonator 1 includes a substrate 10, a first resonator 11, a second resonator 12 and a coupling mechanism 14. The first resonator 11 is connected with the second resonator 12 through the coupling mechanism 14, and the first resonator 11 and the second resonator 12 are connected with the substrate 10 and may be displaced relative to the substrate 10 under an external force.

Specifically, the first resonator 11 includes a first vibrator 112 and a plurality of first connecting arms 111. The plurality of first connecting arms 111 are arranged on two opposite sides of the first vibrator 112 perpendicular to a vibration direction of the first vibrator 112, and configured to connect the first vibrator 112 with the substrate 10. The plurality of first connecting arms 111 are flexible connecting arms.

The second resonator 12 includes a second vibrator 122 and a plurality of second connecting arms 121. The plurality of second connecting arms 121 are arranged on two opposite sides of the second vibrator 122 perpendicular to a vibration direction the second vibrator 122, and configured to connect the second vibrator 122 with the substrate 10, where the vibration direction of the second vibrator 122 is opposite to that of the first vibrator 112. The plurality of second connecting arms 121 are flexible connecting arms.

The coupling mechanism 14 includes a coupling arm 146, a support shaft 140, a first connecting piece 144 and a second connecting piece 145. Herein, the coupling arm 146 includes a first force arm 141, a second force arm 142 and a coupling portion 143. The support shaft 140 has one end connected with the substrate 10, and one other end connected with the coupling portion 143. The first force arm 141 and the second force arm 142 are symmetrically arranged on two opposite sides of the coupling portion 143 with the support shaft 140 as a symmetry axis, and one end of the first force arm 141 disposed away from the coupling portion 143 is connected with the first resonator 11 through the first connecting piece 144, and one end of the second force arm 142 disposed away from the coupling portion 143 is connected with the second resonator 12 through the second connecting piece 145.

Herein, the first connecting piece 144 and the second connecting piece 145 are both elastic connecting pieces.

The coupling arm 146 or the support shaft 140 is made of an elastic material, or the coupling arm 146 and the support shaft 140 may be integrally formed of the elastic material.

Figure 5:
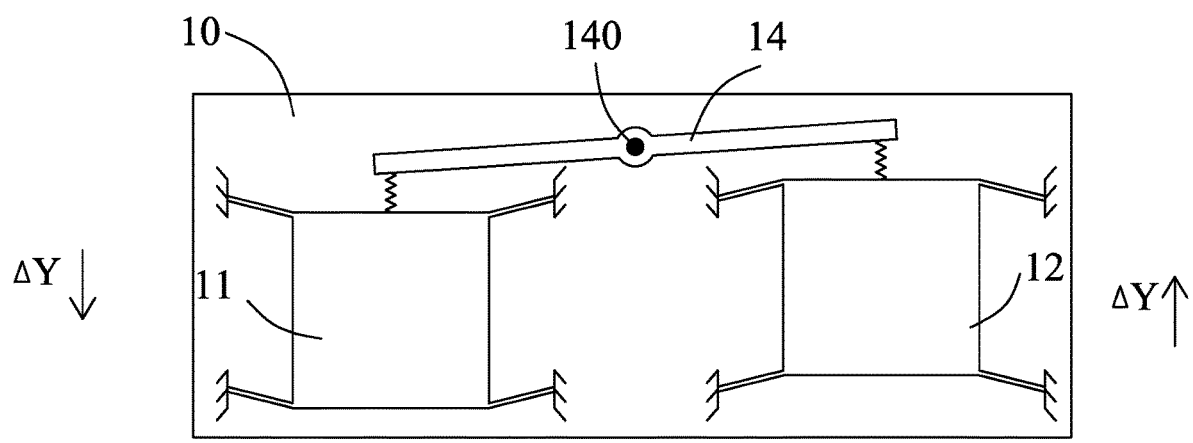
FIG. 5 is a schematic diagram of a plane structure of a differential resonator during vibration provided in the present disclosure.

Referring to FIG. 5, the first resonator 11 is connected with the second resonator 12 through the coupling arm 146, and is connected with the substrate 10 through the support shaft 140. When an external force is applied and the coupling arm 146 deforms and rotates with the support shaft 140 as a fulcrum, the coupling arm 146 may not displace in a direction perpendicular to the vibration direction of the first resonator 11 and the second resonator 12 under a limiting action of the support shaft 140, that is, only a displacement of ΔY in the vibration direction may occur, thereby enabling the first resonator and the second resonator of the differential resonator have more consistent amplitudes.

Figure 6:
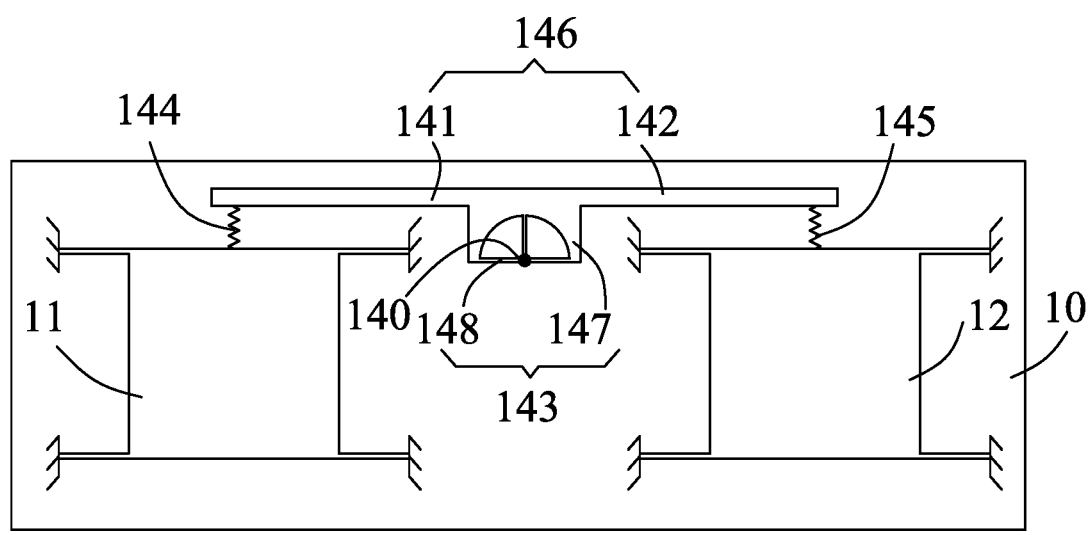
FIG. 6 is a schematic diagram of a plane structure of a modified structure of the differential resonator provided in the present disclosure.

Referring to FIG. 6, in some embodiments, the support shaft 140 is connected with the coupling portion 143. The coupling portion 143 may include a body 147 and a spoke 148. Herein, at least two spokes 148 are provided. The body 147 is connected with the first force arm 141 and the second force arm 142. The spoke 148 has one end connected with the body 147, and one other end connected with the support shaft 140.

Specifically, the spoke 148 is an elastic spoke made of an elastic material. The spokes 148 is scattered with an axis of the support shaft 140 as a center and connected with the body 147. When the first resonator 11 or the second resonator 12 vibrates, the spoke 148 is elastically deformed.

Further, the spokes 148 are of the same length and are evenly arranged, so as to ensure that the amplitudes of the first resonator 11 and the second resonator 12 are the same.

In some embodiments, an arc portion is formed on one side of the body 147 adjacent to the spokes 148, and one end of each spoke is connected with the arc portion. The body 147 has two opposite sides, one of which is connected with the first force arm 141, and the other one of which is connected with the second force arm 142. The body 147 protrudes from the first force arm 141 and the second force arm 142 along the vibration direction of the first resonator 11 or the second resonator 12, that is, one side of the body 147 disposed away from the first force arm 141 or the second force arm 142 forms a height difference with the first force arm 141 or the second force arm 142.

In some embodiments, the present disclosure further provides a MEMS sensor. The MEMS sensor includes the aforementioned differential resonator 1. The MEMS sensor may be a differential accelerometer, a differential gyroscope or a differential resonant pressure sensor.

Compared with the existing technology, the differential resonator and MEMS sensor provided in the present disclosure have the following advantages.

The support shaft is provided and utilized to be fixedly connected with the substrate and connected with the coupling arm. The first force arm of the coupling arm is connected with the first resonator through the first connecting piece, and the second force arm of the coupling arm is connected with the second resonator through the second connecting piece. When an external is applied, even if there is a certain quality deviation between the first resonator and the second resonator, the coupling arm may not displace in the direction perpendicular to the vibration direction of the first resonator and the second resonator under the limiting action of the support shaft when the coupling arm rotates with the support shaft as the fulcrum, so that the first resonator and the second resonator of the differential resonator have more consistent amplitudes, and further, the differential resonator has batter process robustness, and higher quality factor and improved capability for suppression of common-mode interference.

The description above is merely embodiments of the present disclosure. It should be noted that those of ordinary skills in the art may make improvements without departing from the inventive concept of the present disclosure, such improvements, however, fall within the protection scope of the present disclosure.

What is claimed is:

1. A differential resonator, comprising a substrate, a first resonator, a second resonator and a coupling mechanism, the first resonator being connected with the second resonator through the coupling mechanism, and the first resonator and the second resonator being connected with the substrate and being able to be displaced relative to the substrate under an external force, wherein:

the coupling mechanism comprises a coupling arm, a support shaft, a first connecting piece and a second connecting piece;

the coupling arm comprises a first force arm, a second force arm and a coupling portion;

the support shaft has one end connected with the substrate and one other end connected with the coupling portion; and the first force arm and the second force arm are symmetrically arranged on two opposite sides of the coupling portion with the support shaft as a symmetry axis, and one end of the first force arm disposed away from the coupling portion is connected with the first resonator through the first connecting piece, and one end of the second force arm disposed away from the coupling portion is connected with the second resonator through the second connecting piece;

the coupling portion comprises a body and at least two elastic spokes made of an elastic material, the body is connected with the first force arm and the second force arm, the at least two spokes each has one end connected with the body and one other end connected with the support shaft;

an arc portion is formed offset from center on one side of the body adjacent to the at least two spokes, and the at least two spoke each has one end connected with the arc portion.

2. The differential resonator according to claim 1, wherein the at least two spokes each is scattered with an axis of the support shaft as a center and connected with the body.

3. The differential resonator according to claim 2, wherein the at least two spokes are of the same length and are evenly arranged.

4. The differential resonator according to claim 1, wherein the body has two opposite sides, one of which is connected with the first force arm, and the other of which is connected with the second force arm, and the body protrudes from the first force arm and the second force arm along a vibration direction of the first resonator or the second resonator.

5. The differential resonator according to claim 1, wherein the coupling arm and the support shaft are integrally formed.

6. The differential resonator according to claim 1, wherein both the first connecting piece and the second connecting piece are elastic connecting pieces.

7. A micro electromechanical systems sensor, comprising a differential resonator as described in claim 1.

* * * * *